United States Patent
Nguyen et al.

(10) Patent No.: US 7,128,806 B2
(45) Date of Patent: Oct. 31, 2006

(54) MASK ETCH PROCESSING APPARATUS

(75) Inventors: Khiem Nguyen, San Jose, CA (US); Peter Satitpunwaycha, Santa Clara, CA (US); Alfred W. Mak, Union City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 266 days.

(21) Appl. No.: 10/689,783

(22) Filed: Oct. 21, 2003

(65) Prior Publication Data

US 2005/0082007 A1   Apr. 21, 2005

(51) Int. Cl.
*H01L 21/306* (2006.01)
*C23F 1/00* (2006.01)

(52) U.S. Cl. .................. 156/345.51; 118/720; 118/721

(58) Field of Classification Search .......... 156/345.51; 118/720, 721
See application file for complete search history.

(56) References Cited

U.S. PATENT DOCUMENTS

| | | | |
|---|---|---|---|
| 2,639,392 A * | 5/1953 | Warner, Jr. ................. 310/312 |
| 4,586,743 A | 5/1986 | Edwards et al. |
| 4,705,951 A | 11/1987 | Layman et al. |
| 4,813,732 A | 3/1989 | Klem |
| 4,842,683 A | 6/1989 | Cheng et al. |
| 4,869,801 A | 9/1989 | Helms et al. |
| 5,022,695 A | 6/1991 | Ayers et al. |
| 5,133,635 A | 7/1992 | Malin et al. |
| 5,180,276 A | 1/1993 | Hendrickson |
| 5,280,983 A | 1/1994 | Maydan et al. |
| 5,324,155 A | 6/1994 | Goodwin et al. |
| 5,374,147 A | 12/1994 | Hiroki et al. |
| 5,469,035 A | 11/1995 | Lowrance |
| 5,580,388 A | 12/1996 | Moore |
| 5,611,865 A | 3/1997 | White et al. |
| 5,632,873 A * | 5/1997 | Stevens et al. ........ 204/298.15 |
| 5,643,366 A | 7/1997 | Somekh et al. |
| 5,647,626 A | 7/1997 | Chen et al. |
| 5,669,644 A | 9/1997 | Kaihotsu et al. |
| 5,673,922 A * | 10/1997 | Sherstinsky et al. ........ 279/133 |
| 5,702,228 A | 12/1997 | Tamai et al. |

(Continued)

FOREIGN PATENT DOCUMENTS

EP   0 423 608 A1   4/1991

(Continued)

OTHER PUBLICATIONS

PCT Partial International Search Report from PCT/US01/07932, Dated Sep. 18, 2001.

(Continued)

*Primary Examiner*—Parviz Hassanzadeh
*Assistant Examiner*—Rakesh K Dhingra
(74) *Attorney, Agent, or Firm*—Patterson & Sheridan LLP (57) ABSTRACT

Method and apparatus for supporting and transferring a substrate in a semiconductor wafer processing system are provided. In one aspect, an apparatus is provided for supporting a substrate comprising-a cover ring comprising a base having a bore disposed therethough, the base having an upper surface and one or more raised surfaces disposed adjacent the bore, wherein the raised surface comprise one or more first substrate support members disposed adjacent an edge of the bore and a capture ring disposed on the cover ring, the capture ring comprising a semi-circular annular ring having an inner perimeter corresponding to the bore of the cover ring and one or more second substrate support members disposed on the inner perimeter and adapted to receive a substrate, wherein the capture ring is adapted to mate with the cover ring and form one contiguous raised surface on the cover ring.

34 Claims, 11 Drawing Sheets

U.S. PATENT DOCUMENTS

| | | | |
|---|---|---|---|
| 5,720,590 A | 2/1998 | Hofmeister | |
| 5,733,096 A | 3/1998 | Van Doren et al. | |
| 5,791,895 A | 8/1998 | Kyung et al. | |
| 5,820,685 A | 10/1998 | Kurihara et al. | |
| 5,922,133 A * | 7/1999 | Tepman et al. | 118/720 |
| 6,074,488 A * | 6/2000 | Roderick et al. | 118/728 |
| 6,203,617 B1 | 3/2001 | Tanoue et al. | |
| 6,217,663 B1 | 4/2001 | Inokuchi et al. | |
| 6,537,011 B1 | 3/2003 | Wang et al. | |
| 6,589,352 B1 * | 7/2003 | Yudovsky et al. | 118/729 |
| 6,676,759 B1 * | 1/2004 | Takagi | 118/728 |
| 6,726,804 B1 | 4/2004 | Wang et al. | |
| 6,776,849 B1 * | 8/2004 | Aggarwal et al. | 118/728 |
| 2003/0220708 A1 | 11/2003 | Sahin et al. | |

FOREIGN PATENT DOCUMENTS

| | | |
|---|---|---|
| EP | 0 793 262 A2 | 9/1997 |
| EP | 0 840 358 A2 | 5/1998 |
| JP | 61-273441 | 12/1996 |
| JP | 10-74814 | 3/1998 |
| JP | 11-008291 | 1/1999 |
| WO | 99/23691 | 5/1999 |
| WO | WO 01/69660 A2 | 9/2001 |

OTHER PUBLICATIONS

U.S. Appl. No. 10/782,300, filed Feb. 18, 2004 (AMAT/8403).

* cited by examiner

MASK ETCH PROCESSING APPARATUS

BACKGROUND OF THE INVENTION

1. Field of the Invention

Embodiments of the present invention generally relate to a method and apparatus for supporting and transferring substrates during photomask fabrication.

2. Description of the Related Art

Semiconductor device geometries have dramatically decreased in size since such devices were first introduced several decades ago. Since then, integrated circuits have generally followed the two year/half-size rule (often called Moore's Law), which states that the number of devices on a chip doubles every two years. Today's fabrication plants are routinely producing devices having 0.35 µm and even 0.18 µm feature sizes, and tomorrow's plants soon will be producing devices having even smaller geometries.

Increasing circuit densities have placed additional demands on processes used to fabricate semi-conductor devices. For example, as circuit densities increase, the widths of vias, contacts and other features, as well as the dielectric materials between them, decrease to sub-micron dimensions. However, the thickness of the dielectric layers remains substantially constant, with the result that the aspect ratios for the features, i.e., their height divided by width, increases. Reliable formation of high aspect ratio features is important to the success of sub-micron technology and to the continued effort to increase circuit density and quality of individual substrates and die.

High aspect ratio features are conventionally formed by patterning a surface of a substrate to define the dimensions of the features and then etching the substrate to remove material and define the features. To form high aspect ratio features with a desired ratio of height to width, the dimensions of the features are required to be formed with certain parameters, which is typically defined as the critical dimensions of the features. Reliable formation of high aspect ratio features with desired critical dimensions requires precise patterning and subsequent etching of the substrate.

A technique commonly used to form precise patterns on substrates is photolithography. In conventional photolithographic processes, a photoresist material is applied on a substrate layer to be etched. A light source emitting ultraviolet (UV) light is typically used to expose the photoresist layer to chemically alter the composition of the photoresist. However, the photoresist layer is only selectively exposed. In this respect, a photomask, or "reticle," is positioned between the light source and the substrate being processed. The photomask contains the desired configuration of features for the substrate. The exposed, or alternatively, the unexposed photoresist material is then removed to expose the underlying material of the substrate. The retained photoresist material remains as an etch resistant pattern on the substrate. The exposed underlying material may then be etched to form the desired features in the substrate, i.e., contacts, vias, or other features.

Photolithographic photomasks, or reticles, typically comprise a substrate of an optically transparent silicon based material, such as quartz. A light-shielding layer of metal, typically chromium, is patterned on the surface of the substrate. The metal layer is patterned and etched to form features which define the pattern, and correspond to the dimensions of the features to be transferred to a substrate, such as a semiconductor wafer.

The deposition and etching processes employed to fabricate the photomask requires that the substrate be transferred and supported within a processing system. It has become desirable to utilize processing equipment and systems which are configured for processing the substrates themselves when fabricating the photomasks. However, these systems are typically configured to process circular substrates, and must be reconfigured to support and transfer rectangular photomasks. In addition, the systems used to support and transport the substrates used in photomask fabrication must carefully handle the substrates to prevent scratches and other defects from being formed on the substrates. These defects can alter the light transmission properties of the substrates and result in defective photomasks.

Therefore, there is a need for a method and apparatus for transferring and supporting substrates in processing systems which minimizes defect formation.

SUMMARY OF THE INVENTION

The present invention generally provides a substrate support member to minimize defect formation in a substrate during processing and handling of substrates in a plasma etch chamber. In one aspect, an apparatus is provided for supporting a substrate on a pedestal or cathode in a processing chamber to minimize contact between the substrate and the chamber components during processing.

In one aspect, an apparatus is provided for supporting a substrate comprising a cover ring comprising a base having a bore disposed therethough, the base having an upper surface and one or more raised surfaces disposed adjacent the bore, wherein the raised surface comprise one or more first substrate support members disposed adjacent an edge of the bore and a capture ring disposed on the cover ring, the capture ring comprising a semi-circular annular ring having an inner perimeter corresponding to the bore of the cover ring and one or more second substrate support members disposed on the inner perimeter and adapted to receive a substrate, wherein the capture ring is adapted to mate with the cover ring and form one contiguous raised surface on the cover ring.

The apparatus for supporting a substrate may be used in a processing chamber comprising an enclosure defining a process region, which processing chamber may also be used in a substrate processing system comprising a transfer chamber, at least the one processing chamber, and a substrate handler disposed in the transfer chamber.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Aspects of the invention will be described below in reference to an inductively coupled plasma etch chamber. Suitable inductively coupled plasma etch chambers include the ETEC Tetra™ photomask etch chambers, such as the ETEC Tetra I™ photomask etch chamber and the ETEC Tetra II™ photomask etch chamber, available from ETEC of Hayward, Calif., or optionally, a Decoupled Plasma Source DPS™ processing chambers, such as the DPS I™, DPS II™, and DPS +™ processing chambers available from Applied Materials, Inc., of Santa Clara, Calif.

Other process chambers may be used including, for example, capacitively coupled parallel plate chambers and magnetically enhanced ion etch chambers, as well as inductively coupled plasma etch chambers of different designs. Examples of such suitable processing chambers are disclosed in U.S. patent application Ser. No. 09/325,026, filed on Jun. 3, 1999, which is incorporated by reference to the extent not inconsistent with the claims and disclosures described herein. Although the processes are advantageously performed with the DPS™ processing chamber, the description in conjunction with the DPS™ processing chamber is illustrative and should not be construed or interpreted to limit the scope of aspects of the invention.

Figure 1:
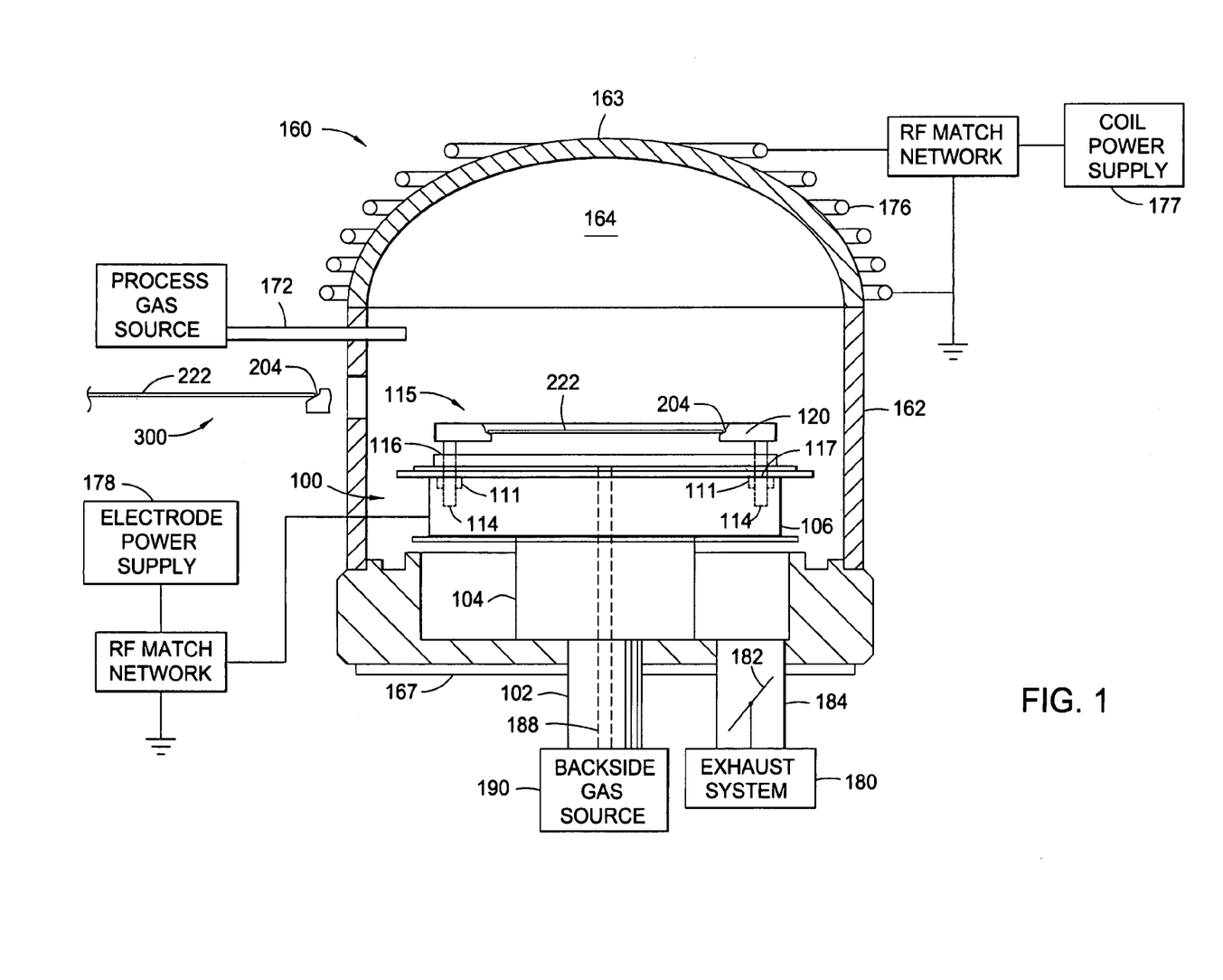
FIG. 1 is a schematic view of one embodiment of an etching chamber containing a substrate support member.

FIG. 1 is a schematic cross sectional view of one embodiment of a process chamber 160 having a substrate support member disposed therein and a substrate handler blade 300 positioned adjacent thereto. The process chamber 160 generally includes a cylindrical side wall or chamber body 162, an energy transparent dome ceiling 163 and a chamber bottom 167. An inductive coil 176 is disposed around at least a portion of the dome 163. The chamber body 162 and chamber bottom 167 of the chamber 160 can be made from a metal, such as anodized aluminum, and the dome 163 can be made of an energy transparent material such as a ceramic or other dielectric material. A substrate support member 100, such as a cathode assembly, is disposed in the chamber 160 to support a substrate 222 during processing. A plasma zone 164 is defined by the process chamber 160 above an upper surface of the substrate support member 100. A top housing (not shown) generally encloses the process chamber 160.

Process gases are introduced into the plasma etch chamber 160 through a gas distributor 172 peripherally disposed about the substrate support member 100. The gas distributor is shown illustratively, and may be disposed in other configurations, such as disposed at the top of dome 163. Process gases and etchant byproducts are exhausted from the process chamber 160 through an exhaust system 180. A throttle valve 182 is provided in an exhaust port 184 for controlling the pressure in the plasma etch chamber 160. An endpoint measurement device may be included to determine the endpoint of a process performed in the chamber.

The substrate support member 100 has a substrate support assembly 115 disposed thereon. The substrate support assembly 115 includes a capture ring 120 having one or more substrate support members disposed thereon or otherwise connected thereto disposed on a cover ring 116 having one or more substrate support members to receive and support a substrate for processing in the chamber 160. The substrate support member 100 will be defined in more detail below, and the cooperation of the substrate support member 100 with a substrate handler blade will be described and illustrated below.

A cathode 112 (not shown in FIG. 1) is disposed in the base 106 of the substrate support member 100 and is electrically coupled to an electrode power supply 178 to generate a capacitive electric field in the plasma etch chamber 160. Typically an RF voltage is applied to the cathode 112 of the substrate support member 100 while the chamber body 162 is electrically grounded. The capacitive electric field forms a bias which accelerates inductively formed plasma species toward the substrate 222 to provide a more vertically oriented anisotropic etching of the substrate 222.

Figure 2:
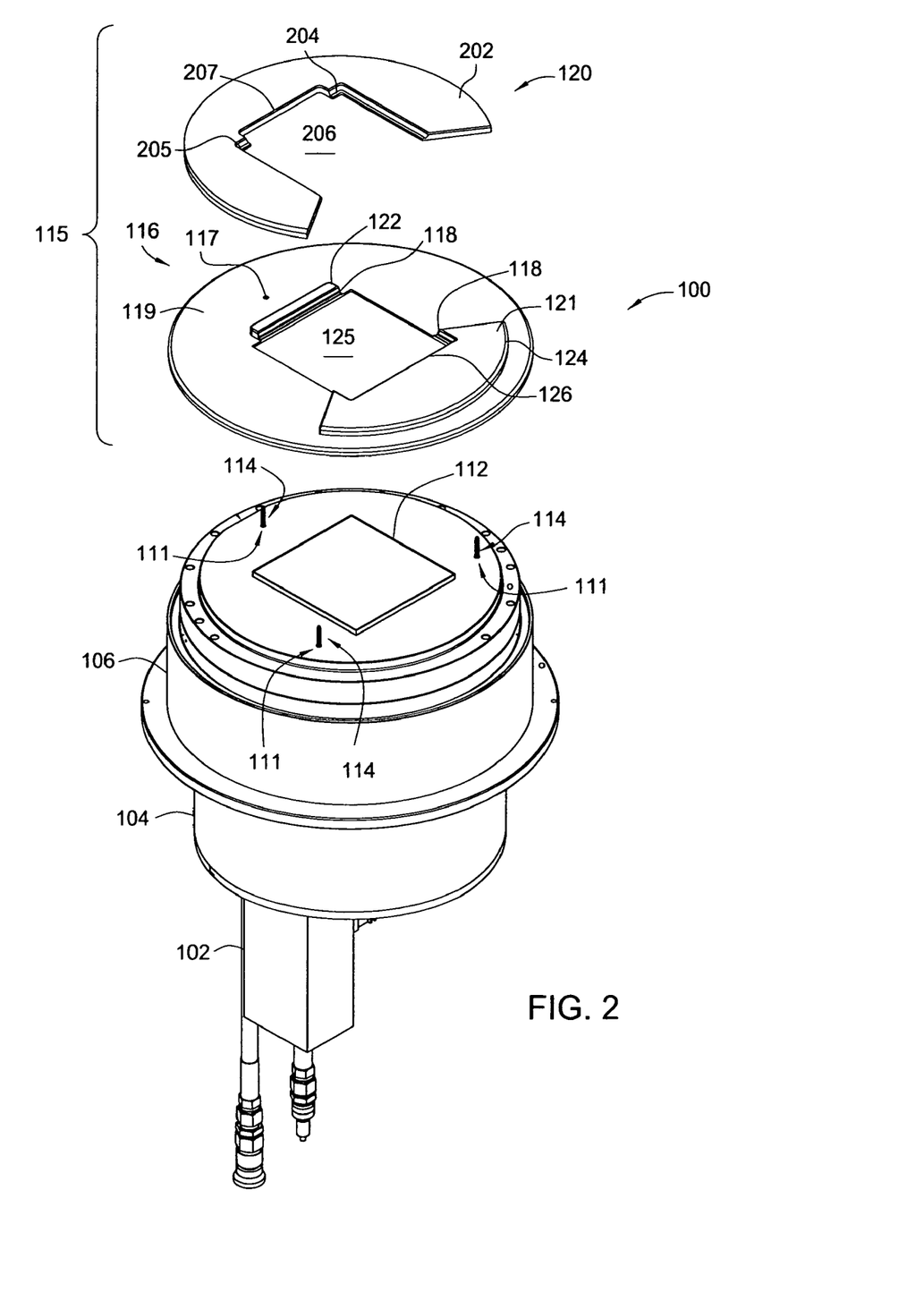
FIG. 2 is an exploded perspective view of the substrate support member of FIG. 1.

FIG. 2 is an exploded perspective view of one embodiment of a substrate support member 100. The substrate support member 100 includes a body 106, a substrate supporting assembly 115 including a cover ring 116 and a capture ring 120. The body 106 is mounted on a bulk head assembly, or shaft, 102. In the embodiment shown, the body 106 is stationary in the chamber, however, in an alternative embodiment, the body 106 or a portion of the body 106 may be moveable within the chamber. The cathode 112 disposed in the base 106 may vertically extend above the surface of the body 106. Channels 111 (three are shown) are also disposed through the body 106 and house internally movable lift pins 114 therein. The lift pins 114 engage the lower surface of the capture ring 120 to move the capture ring vertically within the chamber relative to the cover ring 116. The body 106 may comprise a temperature controlled base adapted to regulate the temperature of the substrate support assembly 115, and thus, a substrate 222 disposed thereon. The body 106 can be made of a material inert to the process formed in the processing chamber including, for example, aluminum oxide, or aluminum, and substrate support assembly 115 components can be made of aluminum or aluminum oxide. The body 106 may include fluid channels, heating elements, e.g., resistive heating elements or other temperature control members.

The body 106 of the substrate support member 100 is mounted on a stainless steel base 104, typically disposed on the bottom of a processing chamber (not shown); with the bulk head assembly 102 mounted through the bottom of the processing chamber and coupled to the body 106. The substrate support member 100 is adapted to maintain vacuum isolation between the interior of the chamber and the outside environment. Power, electrical controls, and backpressure gases are provided to the substrate support member 100 via the shaft 102.

Figure 3:
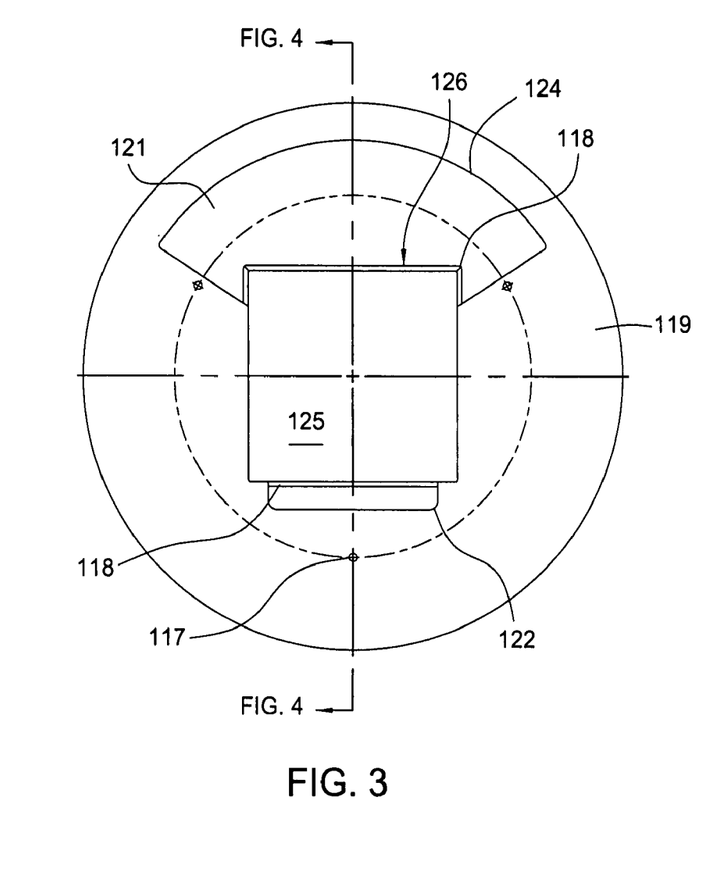
FIG. 3 is a top plan view of one embodiment of a cover ring.
Figure 4:
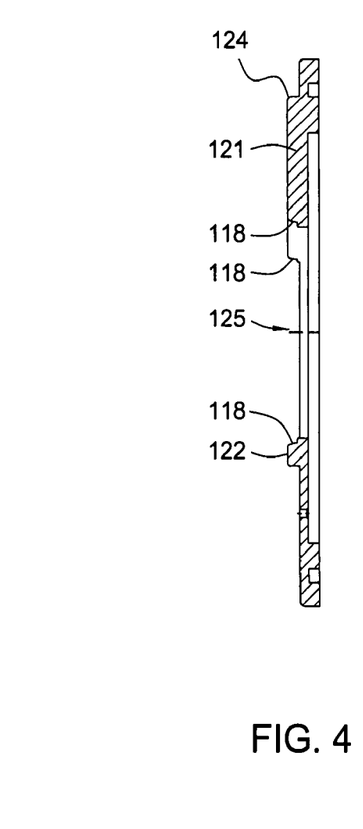
FIG. 4 is a cross-sectional view of the cover ring of FIG. 3.

Referring to FIG. 3, a top view of one embodiment of a cover ring 116, and FIG. 4, a cross-sectional view of FIG. 3, the cover ring 116 includes a base circular ring with an upper surface 119 and raised surfaces 121,122 disposed thereon. A central opening or bore 125 is defined in the upper surface 119 of the cover ring 116. The upper surface 119 and the raised surfaces 121,122 may be monolithic or may be made of separate components connected together. The raised surfaces 121, 122 include a linear raised surface 122 extending along the length of one side of the bore 125 and an arcuate raised surface 121 with an outer diameter 124 co-existing with the radius of the ring and an inner perimeter 126 conforming to the shape of the bore on one or more sides of the bore. Substrate supports 118 are disposed on the raised surfaces 121, 122 of the cover ring 116 and around the perimeter of the bore 125 of the capture ring 120 and form a continuous substrate supporting surface when the capture ring 120 and cover ring 116 are integrated. The substrate supports 118 include substrate receiving surfaces defined by an inner sloped surface of each substrate support 118.

Channels 117 are formed through the cover ring 116 to enable the lift pins 114 disposed through the body 106 to move therethough and lift the capture ring 120 vertically. The vertical movement imparted by the lift pins 114 is used to lift the capture ring 120 to effectuate substrate transfer between a substrate handler blade 300 and the capture ring 120. The actuation of the assembly 115 will be described in more detail below.

Figure 5:
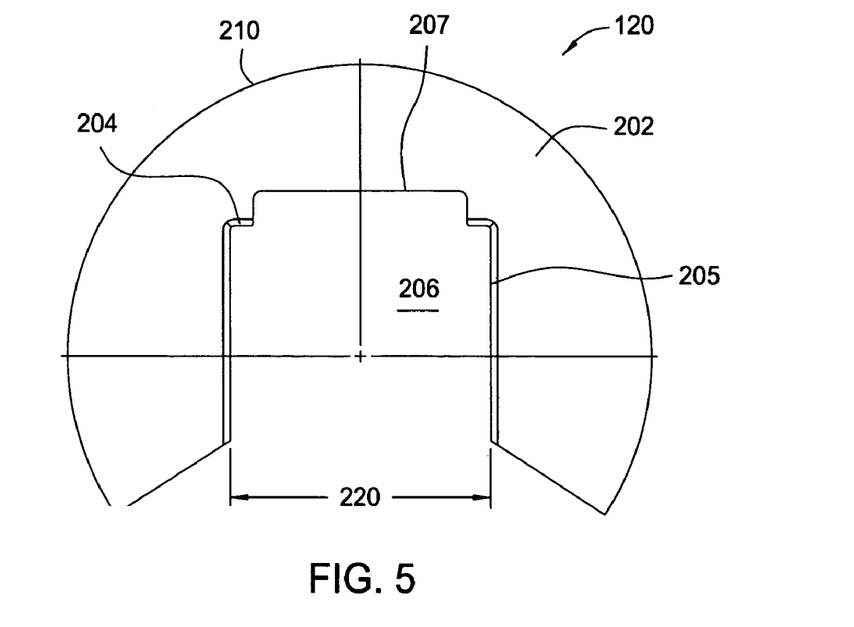
FIG. 5 is a schematic top view of one embodiment of a capture ring
Figure 6:
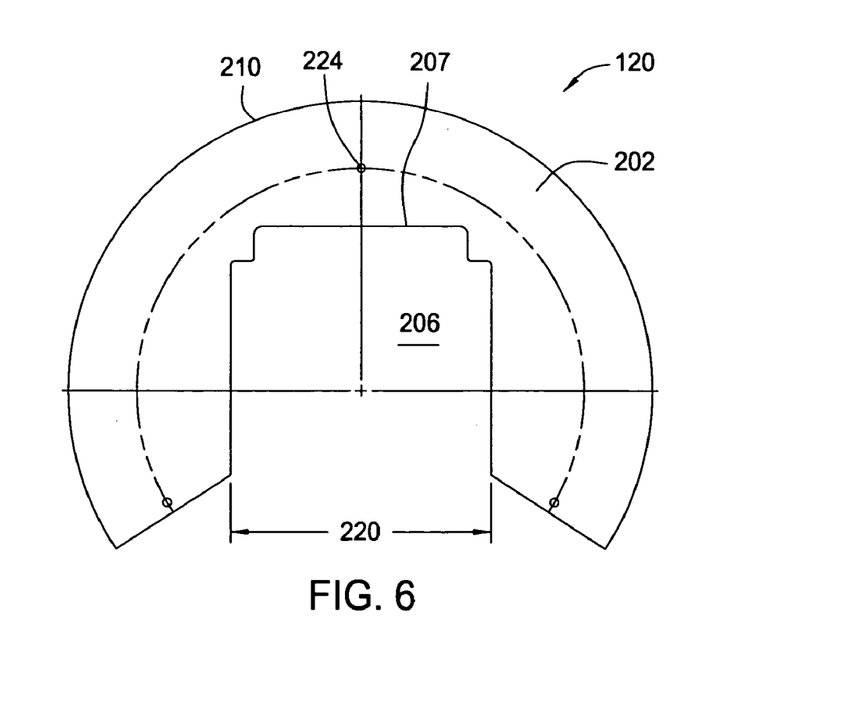
FIG. 6 is a schematic bottom view of the capture ring of FIG. 5.

Referring to FIGS. 5 and 6, the capture ring 120 includes an arcuate base plate 202 having an inner perimeter 207 defining a bore 206 therein. A plurality of substrate supports, such as substrate supports 204, 205, are disposed on the inner perimeter 207. The substrate supports 204, 205 and the base plate 202 define a substrate receiving area. The substrate supports 204, 205 and the base plate 202 are adapted to mate with the substrate supports 118 on the cover ring when contacting the cover ring 116 and the capture ring 120 and define a planar substrate receiving surface for processing. The lift pins 114 move the capture ring 120 vertically above the cover ring 116 during substrate transfer and then lower the capture ring onto the cover ring 116 for processing. The whole assembly 115 may then be moved vertically within the chamber 160.

FIG. 5 is a top view of one embodiment of a capture ring 120. The capture ring 120 includes a base 202 having an inner perimeter 207 and two substrate supports 204, 205 disposed therein. The base 202 is generally an arcuate ring with the central opening 206 defined therein. The base 202 is adapted for mounting on the cover ring 116. The base 202 further includes a circumferential sealing lip 210 formed at the perimeter of the base 202 which forms a seal with the processing chamber (shown in FIG. 1) when the substrate support member 100 is positioned in an upper processing position. A seal formed between the sealing lip 210 and the chamber prevents gases from flowing behind the substrate support member in contact with the lower portion of the chamber.

The substrate support members 204, 205 of the inner perimeter 207 define an opening 220 through which a substrate handler blade can be moved to transfer a substrate (shown and described below in reference to FIGS. 9-13) with minimal contact between components of the system.

FIG. 6 is a bottom view of the capture ring 120 of FIG. 5. A plurality of lift pin recesses 224 are formed in the base 202 around the opening 206 and are adapted to receive the lift pins 114. The lift pin recesses 224 are spaced around the perimeter of the capture ring 120 to provide stable support for the capture ring 120 when the capture ring 120 is lifted into a raised position. The lift pins 114 and lift pin recesses 224 can also be used to align the capture ring 120 on the cover ring 116.

Figure 7:
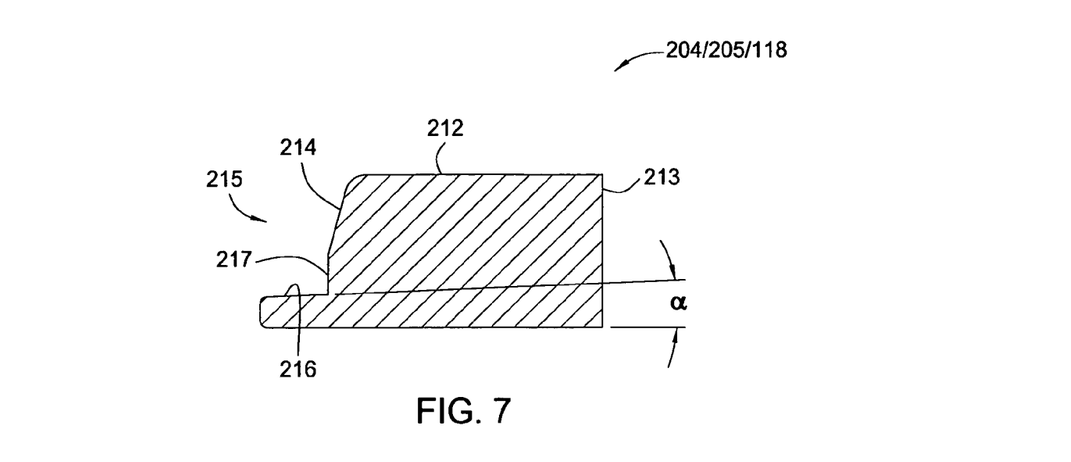
FIG. 7 is a schematic cross-sectional view of one embodiment of a substrate support.

FIG. 7 is a sectional view of the substrate support members 204, 205 of the capture ring 120 and substrate support members 118 of the cover ring 116. The substrate support members 204 include an upper surface 212, an outer surface 213 and an inner surface 215. The inner surface 215 includes an upper substrate aligning surface 214 which is disposed at an incline from the upper surface 212. The upper aligning surface 214 provides gravity assisted gross alignment of a substrate 222 received thereon. The upper aligning surface 214 may have an angle from the normal of between about 5° and about 30°, such as 15°. A generally vertical substrate capturing surface 217 is provided below the substrate aligning surface 214 and defines an outer boundary of a substrate receiving area. The lower portion 216 of the substrate support member 204 has an inclined surface disposed at an angle between about 2° and about 7°, preferably between about 2.5° and about 5°, for example, about 2.5°. The inclination of the substrate support members 204 minimizes the surface area contact between the substrate 222 and the substrate support members 204, 205. The inclined surface and the lower portion 216 also assist in centering the substrate as it is received thereon.

The capture ring 120 and cover ring 116 are generally formed from of an etch resistant, high temperature resistant material, such as aluminum or aluminum oxide, to enable the capture ring 120 and cover ring 116 to be used repetitively in the etching process without damage such as scratching or deformation. The capture ring 120 and cover ring 116 are preferably formed from single pieces of material to ensure a good fit with each other. However, the capture ring 120 and cover ring 116 may be made of multiple components, for example, the raised surfaces of the cover ring 116 may be made of a separate material and bound to the upper surface of the cover ring 116.

Figure 8:
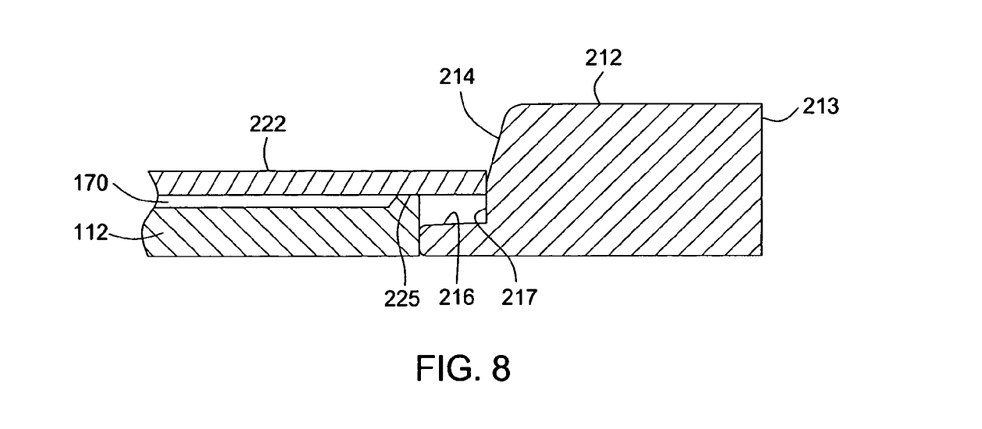
FIG. 8 is a partial cross-sectional view of the substrate in a processing position in relation to the substrate supports described herein.

FIG. 8 is a partial cross sectional view of the substrate 222 disposed on the substrate supporting ridge 225 of the cathode 112 and within a perimeter defined by the substrate supports 118 of the cover ring 116 and substrate supports 204, 205 of the capture ring in a processing position. The substrate supporting ridge 225 of the cathode 112 defines a supporting surface on which the substrate is supported during processing. A space 170 is defined between the substrate supporting ridge 225 and a lower surface of a substrate 222 when the substrate 222 is received on the substrate supporting ridge 225. A backside gas can be flowed into the space 170 during processing to facilitate thermal conduction and to prevent process gases from being introduced behind the substrate 222. The backside gas can be delivered into the space 170, for example, by the backside gas line 188 disposed in the pedestal 116 from a remotely located backside gas source 190 through gas portals (not shown) to the surface of the cathode 112.

To sufficiently transfer heat from the substrate 222 to the substrate support member 100 and prevent backside contamination, a substantial gas pressure may exist beneath the substrate 222. A clamp ring (not shown) may be fitted to the periphery of the capture ring 120 to retain the substrate 222 on the substrate support member 100 when substantial backside gas pressure is applied between the substrate support member 100 and the substrate 222. Such a clamp ring would be similar to that used to retain a substrate on a substrate support member 100 in a MxPTM chamber of a P5000™ platform, as manufactured by Applied Materials, Inc. of Santa Clara, Calif.

FIGS. 9–14 illustrate transfer of a substrate 222 from the blade 300 to the capture ring 120. The blade 300 retrieves a substrate 222 from a loadlock chamber 416 and delivers the substrate 222 into the processing chamber 412 (shown in FIG. 14). One example of a suitable blade 300 for handling the substrate is more fully described in U.S. Pat. No. 6,537,011, issued on Mar. 25, 2003, which is incorporated by reference herein to the extent not inconsistent with the disclosure and claimed aspects herein. The substrate 222 disposed on the blade 300 is then horizontally aligned with the capture ring 120 in a vertically displaced position as described above and shown in FIGS. 5, 9, and 10.

Figure 11:
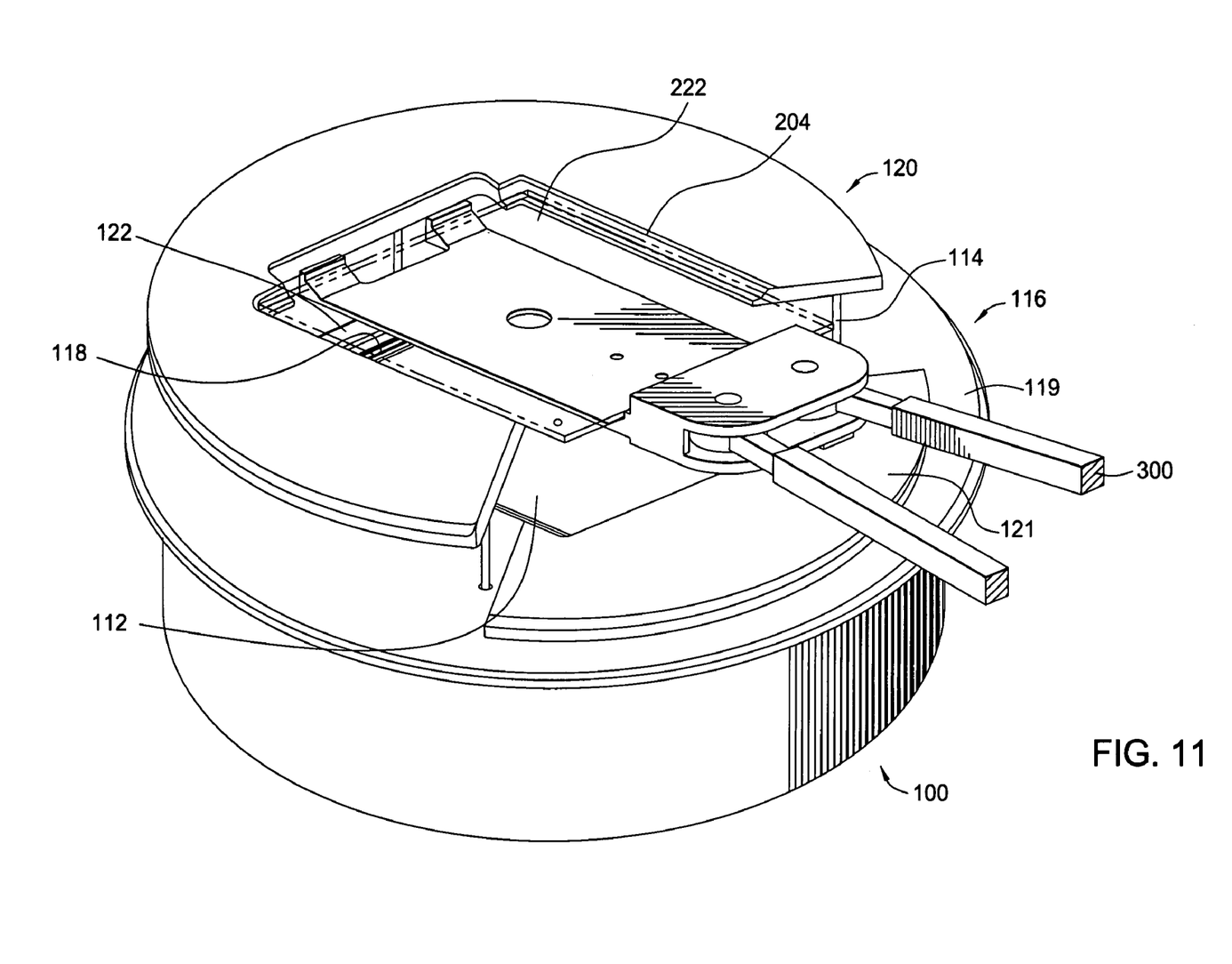
FIG. 11 is a perspective view of the substrate handler of the invention in relation to the capture ring of the invention.
Figure 12:
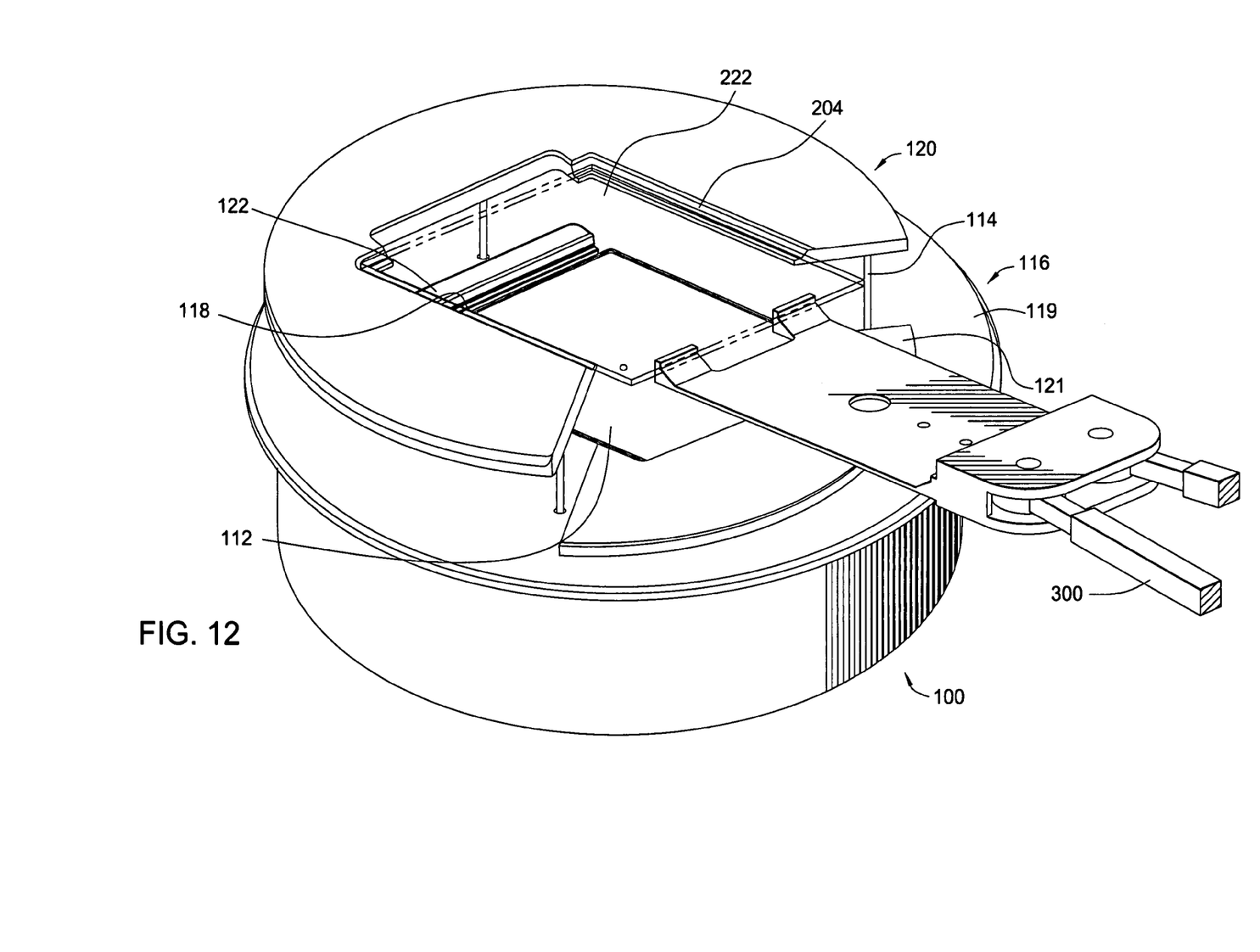
FIG. 12 is perspective view of a substrate in the capture ring of the invention.
Figure 13:
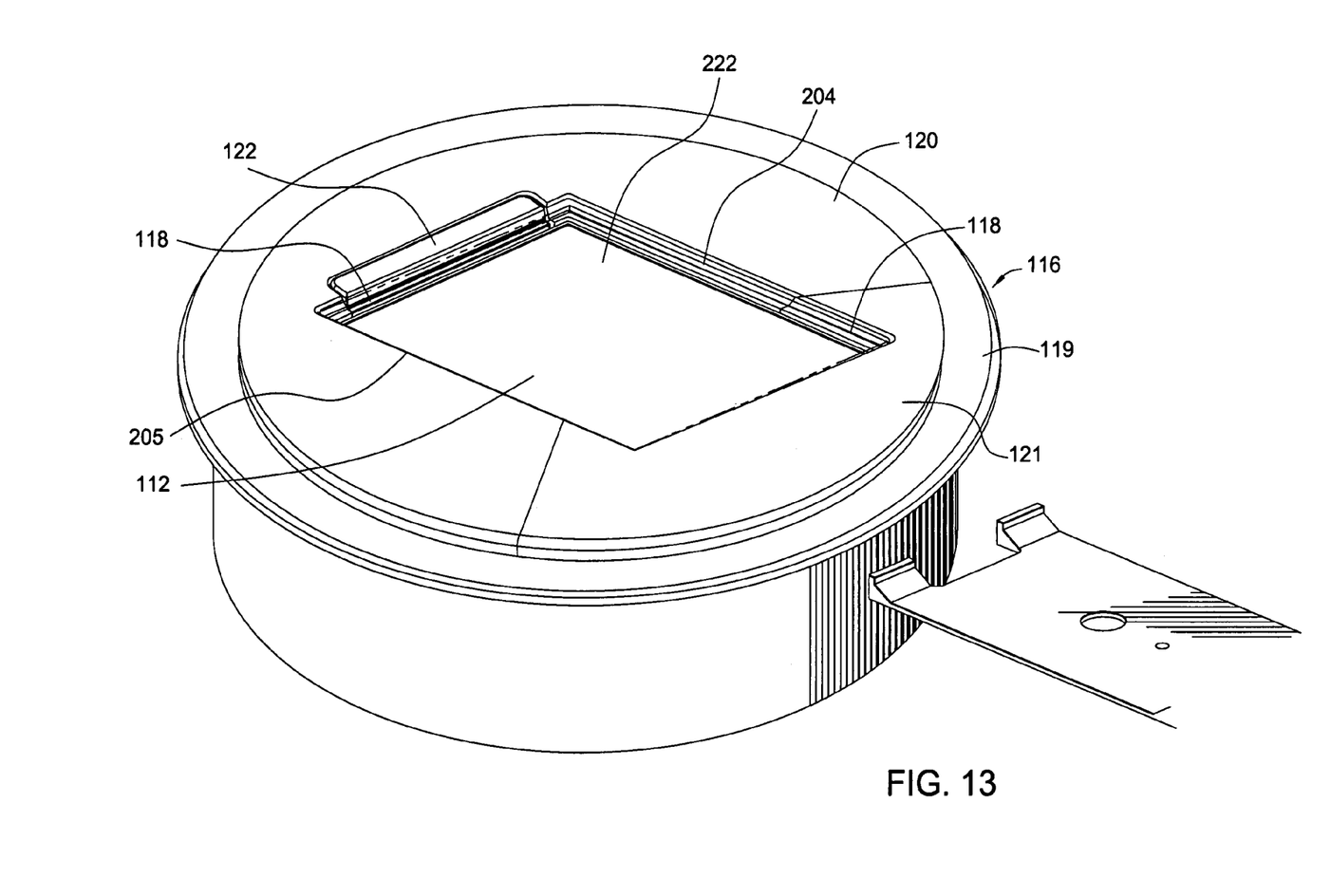
FIG. 13 is perspective view of a substrate in the capture ring of the invention.

The capture ring 120 may then be moved upwardly by lift pins 114 to contact and lift the substrate 222 off the blade 300 as shown in FIG. 11. The lower portion 216 of the substrate supports 204, 205 lift the substrate 222 from the blade 300. The vertical displacement of the capture ring 120 is sufficient to allow to the blade 300 to withdraw from the processing chamber without contacting the top surface 202 of the capture ring 120 or the bottom surface of the substrate 222 as shown in FIG. 12. Once the blade is withdrawn, the capture ring 120 is lowered by the lift pins onto the upper surface 119 of the cover ring 116 for processing as shown in FIG. 13.

Figure 9:
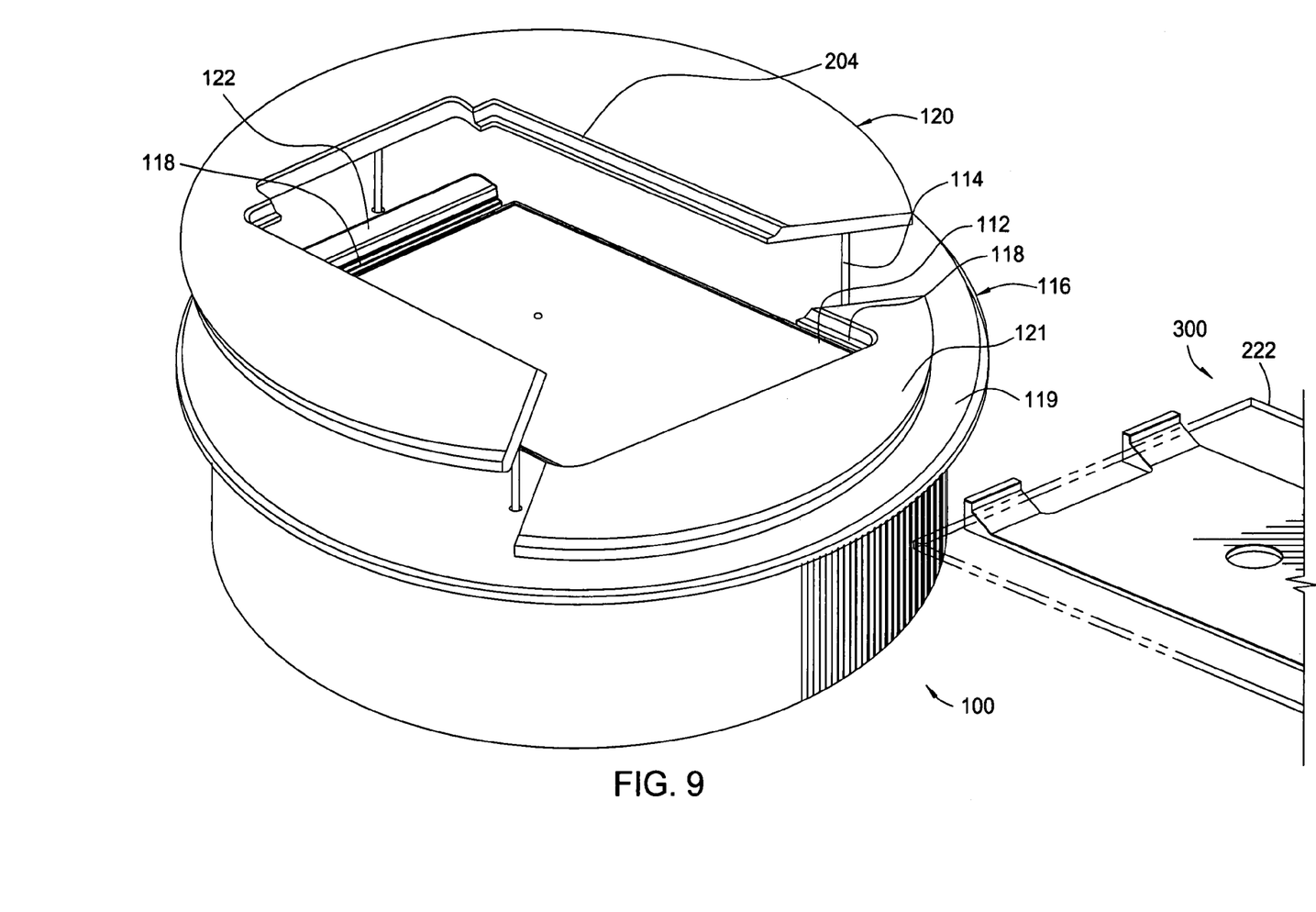
FIG. 9 is a perspective view of the substrate handler of the invention in relation to the capture ring of the invention.
Figure 10:
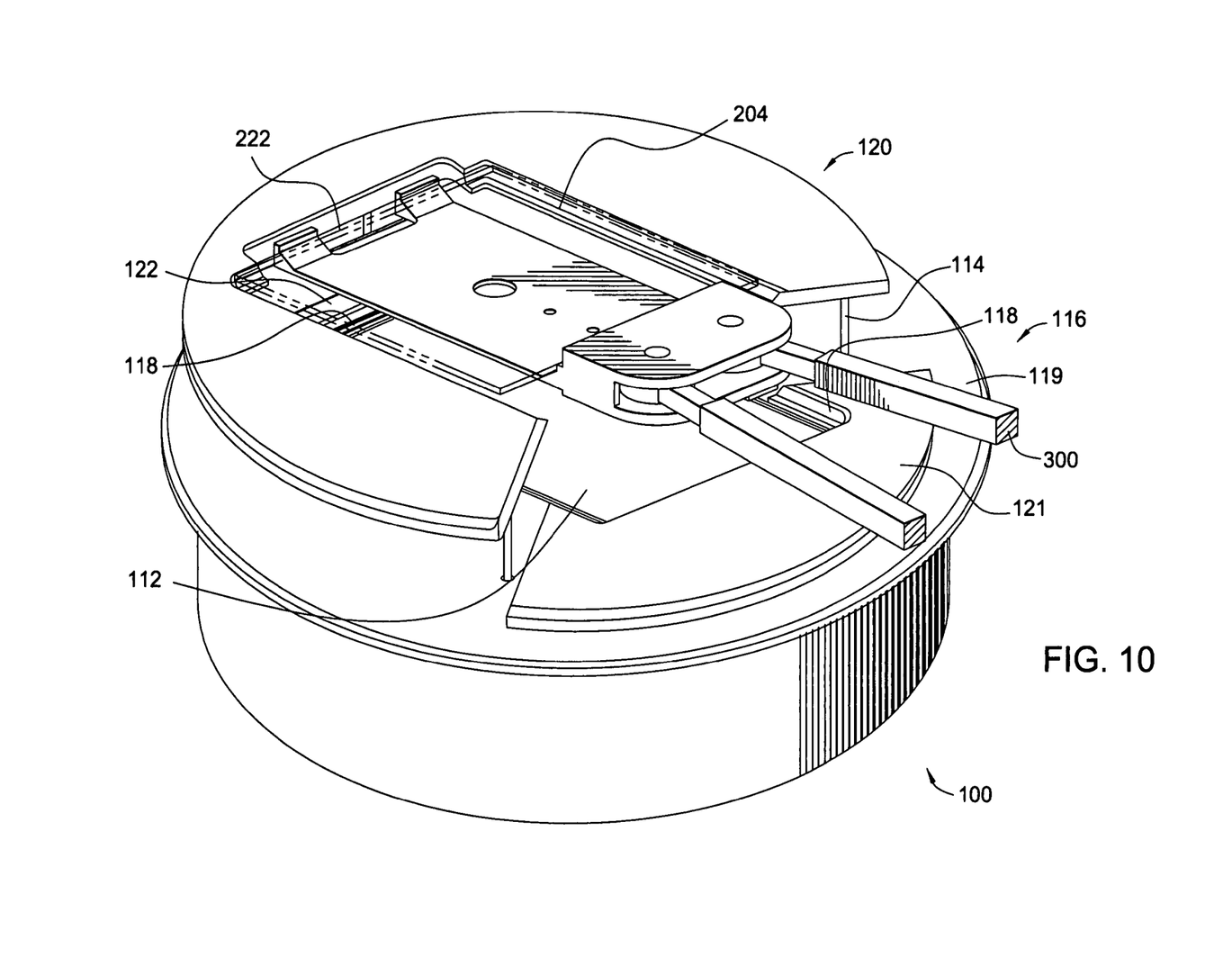
FIG. 10 is a perspective view of FIG. 9.

For retrieving a processed substrate 222 from the capture ring 120, the capture ring 120 is vertically displaced from the cover ring 116 to the substrate transfer position. The substrate handler blade 300 enters the processing chamber 160 and aligns the blade 300 between the substrate 222 and the top surface 202 of the capture ring 120 as illustrated by FIG. 11. When the blade 300 is aligned with the capture ring 120, the blade 300 is disposed in a vertically displaced position below the inclined lower portions 216 of the substrate support members 204, 205. The capture ring 120 is then lowered and the substrate handler blade 300 supports the substrate 222 thereon as illustrated by FIG. 10. The capture ring 120 is vertically displaced in a lowered position to allow the blade 300 to withdraw from the chamber 160 without contact with the capture ring 120 as shown in FIG. 9. In the lowered position, the capture ring 120 is ready to receive another substrate from the blade 300. The substrate handler blade withdraws from the chamber 160 to return the processed substrate to another chamber, for example, a loadlock chamber 416 and then to retrieve another substrate 222 for placement in the processing chamber 160.

The supporting apparatus and sustrate handler lade 300 descried aove may also e taken advantage of in a sustrate processing system 410 providing support for a sustrate. The sustrate processing system 410 may include a transfer chamer 414, at least one processing chamer 160 with a sustrate support memer 100 with a support surface and a capture ring coupled to the support surface, the capture ring adapted to receive a sustrate, and a sustrate handler 418 disposed in the transfer chamer 414. The sustrate handler 418 preferaly has a sustrate handler lade 300 l descried aove. The process chamers are preferaly plasma etch chamers.

Figure 14:
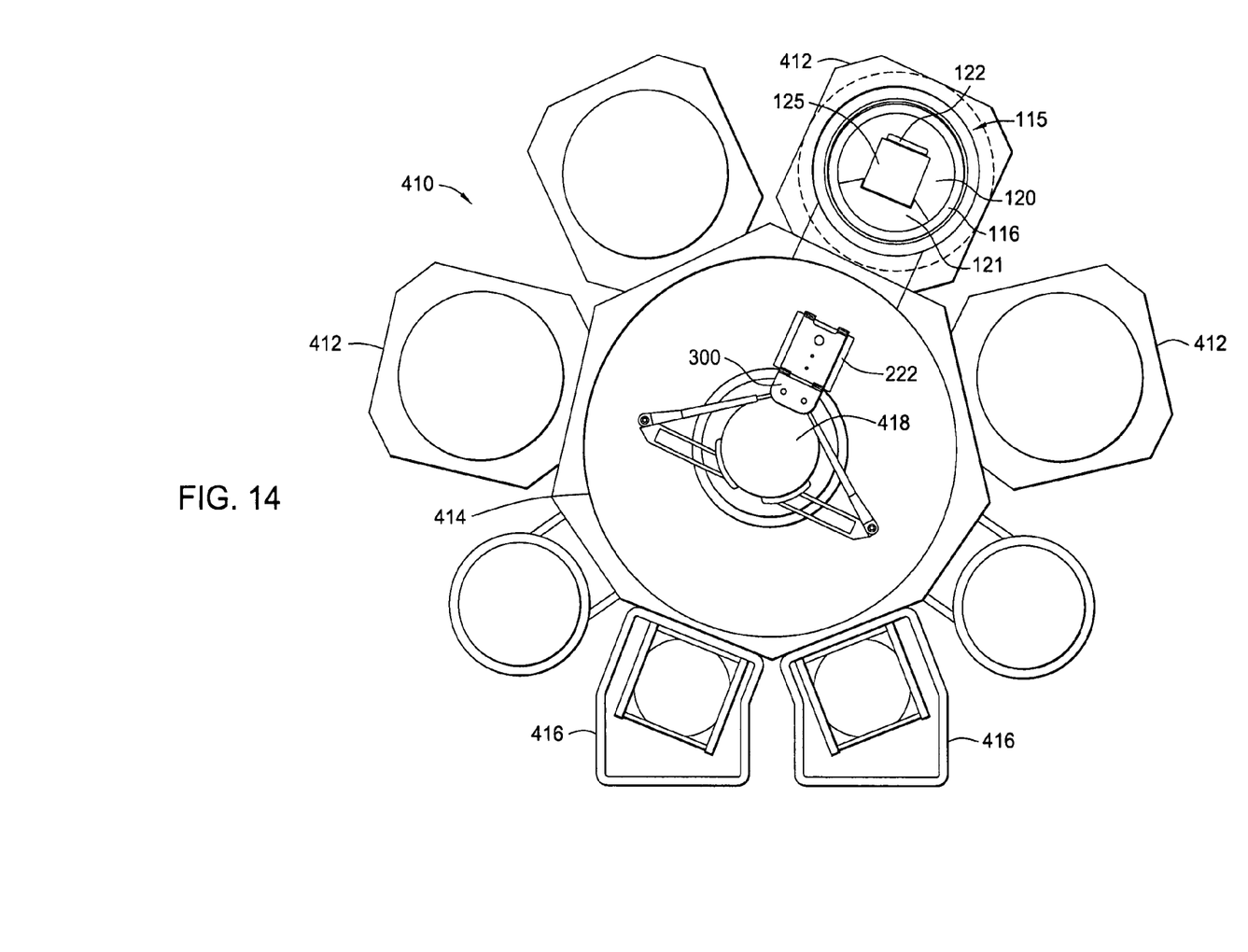
FIG. 14 is a top schematic view of a radial cluster tool for batch processing of semiconductor substrates.

FIG. 14 is a plan view of a vacuum cluster tool 410 suitable for use with the apparatus of the invention described above. The vacuum cluster tool includes multiple substrate processing chambers 412 mounted on a centralized vacuum chamber 414, such as a transfer chamber, for transferring substrates from a substrate cassette located in one or more load lock chambers 416, to one or more process chambers 412. A cluster tool similar to that shown in FIG. 14 is a Centura™ processing system available from Applied Materials, Inc. of Santa Clara, Calif.

Transfer of the substrates between the process chambers 412 is typically managed by a substrate handling module, or substrate handler, 418, preferably with the substrate handling blade 300 mounted thereon. The substrate handler 418 is located in the central transfer chamber 414. After the substrates are processed, the substrates are retrieved from the processing chambers 412 and transferred to one or more of the load lock chamber 416 and into one or more substrate cassette (not shown) disposed within the one or more load lock chambers 416. The substrates can then be retrieved from the loadlock chambers 416 and transferred to the next system for additional processing. In photomask manufacturing processing, the process chambers 412 are etching chambers, preferably plasma etching chambers.

While the foregoing is directed to embodiments of the present invention, other and further embodiments of the invention may be devised without departing from the basic scope thereof, and the scope thereof is determined by the claims that follow.

| REFERENCE NUMERALS | |
| --- | --- |
| Substrate Support Member | 100 |
| Head Assembly | 102 |
| Steel Base | 104 |
| Base | 106 |
| Channels | 111 |
| Cathode | 112 |
| Lift Pins | 114 |
| Support Assembly | 115 |
| Cover Ring | 116 |
| Channels | 117 |
| Substrate Support | 118 |
| Upper Surface | 119 |
| Ring Capture | 120 |
| Raised Surfaces | 121 |
| Raised Surfaces | 122 |
| Outer Diameter | 124 |
| Bore | 125 |
| Inner Perimeter | 126 |
| Process Chamber | 160 |
| Chamber Body | 162 |
| Dome | 163 |
| Plasma Zone | 164 |
| Chamber Bottom | 167 |
| Gas Distributor | 172 |
| Inductive Coil | 176 |
| Coil Power Supply | 177 |
| Electrode Power Supply | 178 |
| Exhaust System | 180 |
| Throttle Valve | 182 |
| Exhaust Port | 184 |
| Backside Gas Line | 188 |
| Backside Gas Source | 190 |
| Base Plate | 202 |
| Substrate Supports | 204 |
| Substrate Supports | 205 |
| Bore | 206 |
| Inner Perimeter | 207 |
| Sealing Lip | 210 |
| Upper Surface | 212 |
| Outer Surface | 213 |
| Aligning Surface | 214 |
| Inner Surface | 215 |
| Lower Portion | 216 |
| Capturing Surface | 217 |
| Substrate | 222 |
| Pin Recesses | 224 |
| Supporting Ridge | 225 |
| Handler Blade | 300 |
| Cluster Tool | 410 |
| Processing Chamber | 412 |
| Transfer Chamber | 414 |
| Lock Chambers | 416 |

What is claimed is:

1. An apparatus for supporting a substrate, comprising:
   a cover ring comprising a base having a bore disposed therethough, the base having an upper surface and one or more raised surfaces disposed adjacent the bore, wherein the raised surface comprise one or more first substrate support members disposed adjacent an edge of the bore; and a capture ring disposed on the cover ring, the capture ring comprising an arcuate base plate having an inner perimeter corresponding to the bore of the cover ring and one or more second substrate support members disposed on the inner perimeter and adapted to receive a substrate, wherein the inner perimeter of the capture ring is adapted to mate with the one or more raised surfaces of the cover ring and form one contiguous raised surface with the cover ring.

2. The apparatus of claim 1, wherein the one or more raised surfaces disposed adjacent the bore comprise a first and second raised surfaces with the first raised surface comprising a linear raised surface extending a length of one side of the bore and the second raised surface comprising an arcuate outer diameter radial with the cover ring and an inner perimeter conforming to one or more sides of the bore.

3. The apparatus of claim 2, wherein the bore is a rectangular shape and the raised surfaces are disposed on opposing sides of the bore.

4. The apparatus of claim 3, wherein the first raised surface is disposed substantially on one side of the bore and the second raised surface is disposed on the opposite side and partially disposed on two adjacent edges.

5. The apparatus of claim 1, wherein the one or more second substrate support members of the capture ring are disposed on opposite sides of the inner perimeter.

6. The apparatus of claim 1, wherein the one or more first and second substrate support members comprise an upper portion, a lower portion, and at least a partial tapered portion disposed between the upper portion and the lower portion.

7. The apparatus of claim 6, wherein the lower portion has an inclined surface between about 2° and about 7°.

8. The apparatus of claim 7, wherein the lower portion has an inclined surface of about 2.5°.

9. The apparatus of claim 1, wherein the cover ring further comprises one or more lift pin recesses adapted to receive one or more lift pins.

10. The apparatus of claim 1, wherein the capture ring and the cover ring comprise an etch resistant material.

11. The apparatus of claim 1, wherein the capture ring and the cover ring comprise aluminum oxide.

12. The apparatus of claim 1, wherein the cover ring is adapted to be mounted on a pedestal.

13. A processing chamber, comprising:
an enclosure defining a process region; and
a pedestal disposed in the enclosure, the pedestal comprising:
 a support surface;
 a cathode disposed in the support surface;
 a cover ring coupled to the support surface, the cover ring comprising a cover ring comprising a base having a bore disposed therethough, the base having an upper surface and one or more raised surfaces disposed adjacent the bore, wherein the raised surface comprise one or more first substrate support members disposed adjacent an edge of the bore; and
 a capture ring disposed on the cover ring, the capture ring comprising an arcuate base plate having an inner perimeter corresponding to the bore of the cover ring and one or more second substrate support members disposed on the inner perimeter and adapted to receive a substrate, wherein the inner perimeter of the capture ring is adapted to mate with the one or more raised surfaces of the cover ring and form one contiguous raised surface with the cover ring.

14. The processing chamber of claim 13, wherein the one or more raised surfaces disposed adjacent the bore comprise a first and second raised surfaces with the first raised surface comprising a linear raised surface extending a length of one side of the bore and the second raised surface comprising an arcuate outer diameter radial with the cover ring and an inner perimeter conforming to one or more sides of the bore.

15. The processing chamber of claim 14, wherein the bore is a rectangular shape and the raised surfaces are disposed on opposing sides of the bore.

16. The processing chamber of claim 15, wherein the first raised surface is disposed substantially on one side of the bore and the second raised surface is disposed on the opposite side and partially disposed on two adjacent edges.

17. The processing chamber of claim 13, wherein the one or more second substrate support members of the capture ring are disposed on opposite sides of the inner perimeter.

18. The processing chamber of claim 13, wherein the one or more first and second substrate support members comprise an upper portion, a lower portion, and at least a partial tapered portion disposed between the upper portion and the lower portion.

19. The processing chamber of claim 18, wherein the lower portion has an inclined surface between about 2° and about 7°.

20. The processing chamber of claim 13, wherein the pedestal further comprises one or more lift pins for vertically displacing the cover ring.

21. The processing chamber of claim 13, wherein the cover ring further comprises one or more lift pin recesses adapted to receive one or more lift pins.

22. The processing chamber of claim 13, wherein the capture ring and the cover ring comprise an etch resistant material.

23. The processing chamber of claim 13, wherein the capture ring and the cover ring comprise aluminum oxide.

24. A substrate processing system, comprising:
a transfer chamber;
at least one processing chamber having a pedestal comprising:
 a support surface having lift pins displaceable therethrough;
 a cathode disposed in the support surface;
 a cover ring coupled to the support surface, the cover ring comprising:
  a cover ring comprising a base having a bore disposed therethough, the base having an upper surface and one or more raised surfaces disposed adjacent the bore, wherein the raised surface comprise one or more first substrate support members disposed adjacent an edge of the bore; and
  a capture ring disposed on the cover ring, the capture ring comprising an arcuate base plate having an inner perimeter corresponding to the bore of the cover ring and one or more second substrate support members disposed on the inner perimeter and adapted to receive a substrate, wherein the inner perimeter of the capture ring is adapted to mate with the one or more raised surfaces of the cover ring and form one contiguous raised surface with the cover ring;
one or more load lock chambers; and
a substrate handler disposed in the transfer chamber.

25. The processing chamber of claim 24, wherein the one or more raised surfaces disposed adjacent the bore comprise a first and second raised surfaces with the first raised surface comprising a linear raised surface extending a length of one side of the bore and the second raised surface comprising an arcuate outer diameter radial with the cover ring and an inner perimeter conforming to one or more sides of the bore.

26. The processing chamber of claim 25, wherein the bore is a rectangular shape and the raised surfaces are disposed on opposing sides of the bore.

27. The processing chamber of claim 26, wherein the first raised surface is disposed substantially on one side of the bore and the second raised surface is disposed on the opposite side and partially disposed on two adjacent edges.

28. The processing chamber of claim 24, wherein the one or more second substrate support members of the capture ring are disposed on opposite sides of the inner perimeter.

29. The processing chamber of claim 24, wherein the one or more first and second substrate support members comprise an upper portion, a lower portion, and at least a partial tapered portion disposed between the upper portion and the lower portion.

30. The processing chamber of claim 29, wherein the lower portion has an inclined surface between about 2° and about 7°.

31. The processing chamber of claim 24, wherein the pedestal further comprises one or more lift pins for vertically displacing the cover ring.

32. The processing chamber of claim 24, wherein the cover ring further comprises one or more lift pin recesses adapted to receive one or more lift pins.

33. The processing chamber of claim 24, wherein the capture ring and the cover ring comprise an etch resistant material.

34. The processing chamber of claim 24, wherein the capture ring and the cover ring comprise aluminum oxide.

* * * * *

UNITED STATES PATENT AND TRADEMARK OFFICE
CERTIFICATE OF CORRECTION

PATENT NO. : 7,128,806 B2  
APPLICATION NO. : 10/689783  
DATED : October 31, 2006  
INVENTOR(S) : Nguyen et al.

Page 1 of 1

It is certified that error appears in the above-identified patent and that said Letters Patent is hereby corrected as shown below:

Title Page, Item [57], ABSTRACT, Line 4: Change "comprising-a" to --comprising a--

Column 2, Line 67: Insert a semicolon after "ring"

Column 6, Line 62: Change "MxPTM" to --MxP$^{TM}$--

Column 7, Lines 41-51: The paragraph beginning on line 41 should read:

> --The supporting apparatus and substrate handler blade 300 described above may also be taken advantage of in a substrate processing system 410 providing support for a substrate. The substrate processing system 410 may include a transfer chamber 414, at least one processing chamber 160 with a substrate support member 100 with a support surface and a capture ring coupled to the support surface, the capture ring adapted to receive a substrate, and a substrate handler 418 disposed in the transfer chamber 414. The substrate handler 418 preferably has a substrate handler blade 300 described above. The process chambers are preferably plasma etch chambers.--

Signed and Sealed this

Twenty-seventh Day of March, 2007

JON W. DUDAS  
*Director of the United States Patent and Trademark Office*